United States Patent
Rothkopf et al.

(10) Patent No.: US 9,343,716 B2
(45) Date of Patent: May 17, 2016

(54) FLEXIBLE BATTERY PACK

(75) Inventors: Fletcher Rothkopf, Los Altos, CA (US); David A. Pakula, San Francisco, CA (US); Daniel W. Jarvis, Sunnyvale, CA (US); John Raff, Menlo Park, CA (US); Jeremy C. Franklin, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 1037 days.

(21) Appl. No.: 13/339,733

(22) Filed: Dec. 29, 2011

(65) Prior Publication Data
US 2013/0171490 A1    Jul. 4, 2013

(51) Int. Cl.
| | | |
|---|---|---|
| H01M 2/10 | (2006.01) | |
| H01M 2/02 | (2006.01) | |
| H01L 31/048 | (2014.01) | |
| H01M 10/04 | (2006.01) | |
| H01M 10/42 | (2006.01) | |
| H01M 10/657 | (2014.01) | |
| H01M 10/647 | (2014.01) | |
| H01M 10/623 | (2014.01) | |
| H01M 10/613 | (2014.01) | |
| H01M 6/46 | (2006.01) | |

(52) U.S. Cl.
CPC ........... *H01M 2/1066* (2013.01); *H01L 31/048* (2013.01); *H01M 2/0207* (2013.01); *H01M 10/0436* (2013.01); *H01M 10/425* (2013.01); *H01M 10/613* (2015.04); *H01M 10/623* (2015.04); *H01M 10/647* (2015.04); *H01M 10/657* (2015.04); *H01M 6/46* (2013.01); *Y02E 10/50* (2013.01); *Y10T 156/10* (2015.01); *Y10T 156/1082* (2015.01)

(58) Field of Classification Search
None
See application file for complete search history.

(56) References Cited

U.S. PATENT DOCUMENTS

| | | | |
|---|---|---|---|
| 2,798,895 A | 7/1957 | Nowotny | |
| 2,798,896 A | 7/1957 | Bly | |
| 4,152,825 A * | 5/1979 | Bruneau | ............ 29/623.2 |
| 4,344,603 A | 8/1982 | Hozumi | |
| 4,455,026 A | 6/1984 | Pinkus | |
| 5,238,222 A | 8/1993 | Sumida | |

(Continued)

FOREIGN PATENT DOCUMENTS

| | | |
|---|---|---|
| EP | 0792741 | 2/1986 |
| EP | 1931010 | 6/2008 |

(Continued)

OTHER PUBLICATIONS

International Search Report, PCT No. PCT/US2011/036847, 4 pages, Dec. 12, 2012.

*Primary Examiner* — Alix Eggerding
(74) *Attorney, Agent, or Firm* — Brownstein Hyatt Farber Schreck, LLP

(57) ABSTRACT

Flexible battery packs for use in electronic devices are disclosed. In one embodiment of the present disclosure, the flexible battery pack may include a plurality of cells, such as galvanic or photovoltaic cells. The battery pack also may include a plurality of laminate layers coupled to the cells that include a top laminate layer and a bottom laminate layer. An adhesive may be used to couple the top and bottom laminate layers together such that each of the plurality of cells is isolated from each other. This arrangement may allow the battery to be shaped to fit a form factor of the electronic device. This arrangement also may allow one or more of the cells to be selectively removed from the plurality, which may be desirable from a manufacturing perspective.

18 Claims, 15 Drawing Sheets

(56) References Cited

U.S. PATENT DOCUMENTS

| | | | |
|---|---|---|---|
| 5,531,601 A * | 7/1996 | Amoroso | A41D 27/085 362/103 |
| 5,580,676 A | 12/1996 | Honda et al. | |
| 6,106,973 A | 8/2000 | Sonozaki et al. | |
| 6,174,164 B1 | 1/2001 | Masjedi | |
| 6,358,644 B1 | 3/2002 | Shibata et al. | |
| 6,368,744 B1 | 4/2002 | Hatazawa et al. | |
| 6,528,204 B1 | 3/2003 | Hikmet et al. | |
| 6,924,551 B2 | 8/2005 | Rumer et al. | |
| 7,288,340 B2 | 10/2007 | Iwamoto | |
| 7,356,923 B2 | 4/2008 | Honer | |
| 7,622,895 B1 | 11/2009 | Griffin | |
| 7,663,064 B2 | 2/2010 | Dutta et al. | |
| 7,887,948 B2 | 2/2011 | Jang et al. | |
| 7,910,243 B2 | 3/2011 | Koh et al. | |
| 7,972,721 B2 | 7/2011 | Kozu et al. | |
| 8,031,122 B2 | 10/2011 | Jang et al. | |
| 8,034,477 B2 | 10/2011 | Yamada | |
| 8,119,278 B2 | 2/2012 | Bailey et al. | |
| 8,124,269 B2 | 2/2012 | Takahashi et al. | |
| 8,241,786 B2 | 8/2012 | Taniguchi et al. | |
| 8,259,013 B2 | 9/2012 | Jang et al. | |
| 8,260,371 B2 | 9/2012 | Kawata et al. | |
| 8,293,402 B2 | 10/2012 | Lee | |
| 8,427,825 B2 | 4/2013 | Szczypinski | |
| 8,445,125 B2 | 5/2013 | Baek et al. | |
| 8,526,998 B2 | 9/2013 | Koide et al. | |
| 8,558,509 B2 | 10/2013 | He et al. | |
| 8,603,670 B2 | 12/2013 | Taniguchi et al. | |
| 8,778,529 B2 | 7/2014 | Seo | |
| 8,942,409 B2 | 1/2015 | Kantor et al. | |
| 8,999,566 B2 | 4/2015 | Chung et al. | |
| 2003/0129483 A1 | 7/2003 | Gross | |
| 2003/0170535 A1 * | 9/2003 | Watanabe | H01M 2/1077 429/158 |
| 2004/0119442 A1 * | 6/2004 | Lee et al. | 320/112 |
| 2005/0142439 A1 | 6/2005 | Lee et al. | |
| 2005/0202310 A1 * | 9/2005 | Yahnker et al. | 429/62 |
| 2007/0072071 A1 * | 3/2007 | Lee | 429/162 |
| 2007/0154794 A1 | 7/2007 | Kim et al. | |
| 2007/0260136 A1 | 11/2007 | Hunter | |
| 2007/0264535 A1 | 11/2007 | Lee et al. | |
| 2008/0001573 A1 * | 1/2008 | Carey | 320/112 |
| 2008/0286644 A1 | 11/2008 | Yeo | |
| 2009/0246620 A1 | 10/2009 | Lee et al. | |
| 2009/0317708 A1 | 12/2009 | Brandl et al. | |
| 2010/0052603 A1 | 3/2010 | Bourilkov et al. | |
| 2010/0081049 A1 | 4/2010 | Holl et al. | |
| 2010/0316911 A1 | 12/2010 | Tesson et al. | |
| 2011/0014954 A1 | 1/2011 | Dossas et al. | |
| 2011/0043309 A1 | 2/2011 | Wamala et al. | |
| 2011/0076550 A1 | 3/2011 | Liang et al. | |
| 2011/0175569 A1 | 7/2011 | Austin | |
| 2011/0210954 A1 | 9/2011 | Murphy et al. | |
| 2011/0215480 A1 | 9/2011 | Gorczyca et al. | |
| 2011/0223447 A1 | 9/2011 | Ignor et al. | |
| 2011/0236727 A1 | 9/2011 | Jang | |
| 2011/0287318 A1 | 11/2011 | Loveness et al. | |
| 2012/0116176 A1 | 5/2012 | Moravec et al. | |
| 2012/0121944 A1 | 5/2012 | Yamamoto et al. | |
| 2012/0305605 A1 | 12/2012 | Vassaux et al. | |
| 2013/0034763 A1 | 2/2013 | Byun | |
| 2013/0053110 A1 | 2/2013 | Pope et al. | |
| 2013/0071696 A1 | 3/2013 | Kim et al. | |
| 2013/0323055 A1 | 12/2013 | Eden et al. | |
| 2014/0050948 A1 | 2/2014 | Hashimoto et al. | |
| 2014/0065474 A1 | 3/2014 | Werner et al. | |
| 2014/0147703 A1 | 5/2014 | Werner et al. | |
| 2014/0147730 A1 | 5/2014 | Werner | |
| 2015/0043156 A1 | 2/2015 | Jain et al. | |
| 2015/0185055 A1 | 7/2015 | King | |
| 2015/0220109 A1 | 8/2015 | von Badinski et al. | |
| 2015/0255776 A1 | 9/2015 | Dabov | |
| 2015/0256007 A1 | 9/2015 | Zadesky et al. | |

FOREIGN PATENT DOCUMENTS

| | | |
|---|---|---|
| EP | 2540221 | 1/2013 |
| EP | 2653053 | 10/2013 |
| JP | 61032951 | 2/1986 |
| JP | 63314770 | 12/1988 |
| JP | 10012200 | 1/1998 |
| JP | 2000058018 | 2/2000 |
| JP | 2001118547 | 4/2001 |
| JP | 2001250515 | 9/2001 |
| JP | 2001250516 | 9/2001 |
| JP | 2001332752 | 11/2001 |
| JP | 2005108750 | 4/2005 |
| JP | 2005129260 | 5/2005 |
| JP | 2005268138 | 9/2005 |
| JP | 2007048725 | 2/2007 |
| JP | 2007165200 | 6/2007 |
| JP | 2010021074 | 1/2010 |
| JP | 2010536246 | 11/2010 |
| KR | 20010007769 | 2/2005 |
| KR | 20090075396 | 7/2009 |
| KR | 1020110100836 | 9/2011 |
| WO | WO00/41252 | 7/2000 |
| WO | WO2008/023199 | 2/2008 |
| WO | WO2011000239 | 1/2011 |
| WO | WO2011/095758 | 8/2011 |

* cited by examiner

FLEXIBLE BATTERY PACK

BACKGROUND OF THE INVENTION

Background

I. Technical Field

The present invention relates generally to batteries for portable electronic devices, and more particularly, flexible battery packs for portable electronic devices.

II. Background Discussion

Electronic devices are ubiquitous in society and can be found in everything from portable cell phones to wristwatches. Many of these electronic devices require some type of portable power source. Many of these electronic devices also have unique form factors. Because of this, the portable power source of any one electronic device may not fit within any other electronic device. Furthermore, these unique form factors often require flexible battery arrangements, whereas conventional battery packs are often too rigid to flexibly conform to these form factors. For example, lithium-ion batteries, such as lithium polymer battery cells, are quite rigid and bending them repeatedly may cause damage to the battery cells and battery failure. As a result of attempting to accommodate inflexible battery packs, the packaging of portable electronic devices may not be optimally sized.

In addition to flexibility problems, conventional battery packs also have drawbacks associated with reliability. For example, conventional batteries that include multiple cells may fail because moisture or dust enters the cavity of any one of the multiple cells. Unfortunately, if one of the multiple cells within the battery fails, the entire battery often fails. Accordingly, flexible battery packs that overcome one or more of the drawbacks of conventional battery packs are desirable.

SUMMARY

Flexible battery packs for use in electronic devices are disclosed that overcome one or more of the drawbacks of conventional battery packs. In one embodiment of the present disclosure, the flexible battery pack may include a plurality of cells, such as galvanic or photovoltaic cells. The battery pack also may include a plurality of laminate layers coupled to the cells that include a top laminate layer and a bottom laminate layer. An adhesive may be used to couple the top and bottom laminate layers together such that each of the plurality of cells is isolated from each other. This arrangement may allow the battery to be shaped to fit a form factor of the electronic device. This arrangement also may allow one or more of the cells to be selectively removed from the plurality, which may be desirable from a manufacturing perspective.

Another embodiment of the present disclosure may include a method of forming a flexible battery pack that includes disposing a plurality of cells on a bottom layer, disposing an adhesive in an area between each of the cells in the plurality, and disposing a top layer over the plurality of cells, where the cells are arranged in an array and at least one cell in the plurality is missing.

Yet another embodiment of the present disclosure may include an electronic device including a user input device and a battery coupled to the input device, where the battery includes a plurality of cells that are substantially isolated from each other and where one or more of the plurality of cells share an adhesive joint.

BRIEF DESCRIPTION OF THE DRAWINGS

The use of the same reference numerals in different drawings indicates similar or identical items.

DETAILED DESCRIPTION OF THE INVENTION

Flexible battery packs for use in electronic devices are disclosed that overcome one or more of the drawbacks of conventional battery packs. In one embodiment of the present disclosure, the flexible battery pack may include a plurality of cells, such as galvanic or photovoltaic cells. The battery pack also may include a plurality of laminate layers coupled to the cells that include a top laminate layer and a bottom laminate layer. An adhesive may be used to couple the top and bottom laminate layers together such that each of the plurality of cells is isolated from each other. This arrangement may allow the battery to be shaped to fit a form factor of the electronic device. This arrangement also may allow one or more of the cells to be selectively removed from the plurality, which may be desirable from a manufacturing perspective.

Although one or more of the embodiments disclosed herein may be described in detail with reference to a particular electronic device, the embodiments should not be interpreted or otherwise used as limiting the scope of the disclosure, including the claims. In addition, one skilled in the art will understand that the following description has broad application and is not necessarily limited to consumer electronics. For example, embodiments of the disclosure have applications in many other fields, including personal transportation, prosthetics, clothing and/or garments, flexible electronics, military, robotics, and the like. Also, while embodiments disclosed herein may focus on certain portable electronic devices, such as cell phones, it should be appreciated that the concepts disclosed herein equally apply to other portable electronic devices where flexible battery packs are desirable. For example, the concepts disclosed herein may be employed in wristwatches, calculators, laptop computers, tablet computers, and/or music players, to name but a few. In addition, it should be appreciated that the concepts disclosed herein may equally apply to non-portable electronic devices, such as desktop computers or televisions where a flexible battery pack may be suitable. Accordingly, the discussion of any embodiment is meant only to be exemplary and is not intended to suggest that the scope of the disclosure, including the claims, is limited to these embodiments.

Figure 1A:
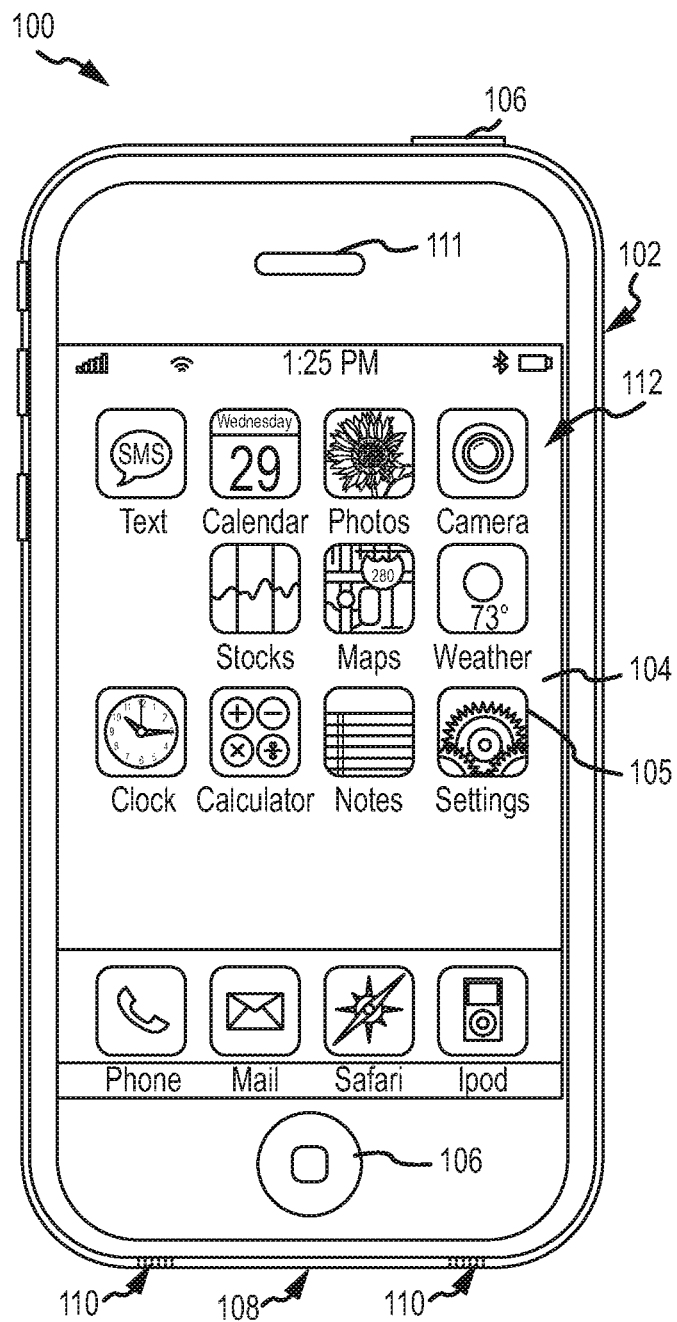
FIG. 1A depicts an electronic device in accordance with one embodiment.

Referring first to FIG. 1A, an electronic device 100 in accordance with one embodiment is illustrated. In some embodiments, the electronic device 100 may be a media player for playing music and/or video, a cellular phone, a personal data organizer, or any combination thereof. Thus, the electronic device 100 may be a unified device providing any one of a combination of the functionality of a media player, a cellular phone, a personal data organizer, and so forth. In addition, the device 100 may allow a user to connect to and communicate through the Internet or through other networks, such as local or wide area networks. For example, the electronic device 100 may allow a user to communicate using email, text messaging, instant messaging, or using other forms of electronic communication. By way of example, the electronic device 100 may be a model of an iPad® tablet computer having a display screen or an iPhone® mobile phone, both available from Apple Inc.

In the illustrated embodiment, the electronic device 100 includes a housing or enclosure 102, a display 104, user input structures 106, and input/output ports 108. The enclosure 102 may be formed from plastic, metal, composite materials, or other suitable materials or any combination thereof. The enclosure 102 may protect the interior circuitry of the electronic device 100 from physical damage, and also may shield the interior circuitry from electromagnetic interference.

The display 104 may be a liquid crystal display (LCD) or may be a light emitting diode (LED) based display, an organic LED based display, or other suitable display. In accordance with certain embodiments of the present technique, the display 104 may display a user interface 112 as well as various images 105, such as logos, avatars, photos, album art, and so forth. Additionally, in one embodiment, the display 104 may be a touch screen through which a user may interact with the user interface. The display 104 also may display various function and/or system indicators to provide feedback to a user, such as power status, call status, memory status, etc. These indicators may be incorporated into the user interface displayed on the display 104. As discussed herein, in certain embodiments, the user interface 112 may be displayed on the display 104, and may provide a way for a user to interact with the electronic device 100. The user interface may be a textual user interface, a graphical user interface (GUI), or any combination thereof, and may include various layers, windows, screens, templates, elements or other components that may be displayed in just a portion or in all areas of the display 104.

In one embodiment, one or more of the user input structures 106 are configured to control the device 100, such as by controlling a mode of operation, an output level, an output type, etc. For instance, the user input structures 106 may include a button to turn the device 100 on or off. In general, embodiments of the electronic device 100 may include any number of user input structures 106, including buttons, switches, a control pad, keys, knobs, a scroll wheel, or any other suitable input structures. The input structures 106 may work with a user interface displayed on the device 100 to control functions of the device 100 or of other devices connected to or used by the device 100. For example, the user input structures 106 may allow a user to navigate a displayed user interface or to return such a displayed user interface to a default or home screen.

Referring still to FIG. 1A, the user interface 112 may, in certain embodiments, allow a user to interface with displayed interface elements via the one or more user input structures 106 and/or via a touch sensitive implementation of the display 104. In such embodiments, the user interface 112 provides interactive functionality, allowing a user to select, by touch screen or other input structure, from among options displayed on the display 104. Thus the user can operate the device 100 by appropriate interaction with the user interface 112. The user interface 112 may be any suitable design to allow interaction between a user and the device 100. Thus, the user interface 112 may provide windows, menus, graphics, text, keyboards or numeric keypads, scrolling devices, or any other elements. In one embodiment, the user interface 112 may include screens, templates, and user interface components, and may include or be divided into any number of these or other elements. The arrangement of the elements of user interface 112 may be hierarchical, such that a screen includes one or more templates, where the template includes one or more user interface components. It should be appreciated that other embodiments may arrange user interface elements in any hierarchical or non-hierarchical structure.

The electronic device 100 may also include various input and output ports 108 to allow connection of additional devices. For example, a port 108 may be a headphone jack that provides for connection of headphones. Additionally, a port 108 may have both input/output capabilities to provide for connection of a headset (e.g. a headphone and microphone combination). Embodiments may include any number of input and/or output ports, including headphone and headset jacks, universal serial bus (USB) ports, Firewire (IEEE-1394) ports, subscriber identity module (SIM) card slots, and AC and/or DC power connectors. Further, the device 100 may use the input and output ports to connect to and send or receive data with any other device, such as other portable electronic devices, personal computers, printers, etc. For example, in one embodiment the electronic device 100 may connect to a personal computer via a Firewire (IEEE-1394) connection to send and receive data files, such as media files. In still other embodiments, the ports 108 may be used to provide power to charge internal batteries within the electronic device 100.

The electronic device 100 may also include various audio input and output portions 110 and 111 respectively. For example, an input receiver 110 may be a microphone that receives user audio input. Embodiments of the input receiver 110 may include coil-and-magnet microphones, condenser microphones, carbon microphones, ribbon microphones, micro-electrical mechanical system (MEMS) microphones, or any combination thereof. An output transmitter 111 may be a speaker that transmits audio signals to a user. In some embodiments, the input receiver 110 and output transmitter 111 may be the same physical device having dual functionality. For example, in the embodiments where the input receiver 110 is a coil-and-magnet type microphone, the output transmitter 111 may be achieved by operating the coil-and-magnet in reverse as a speaker and vice versa.

Figure 1B:
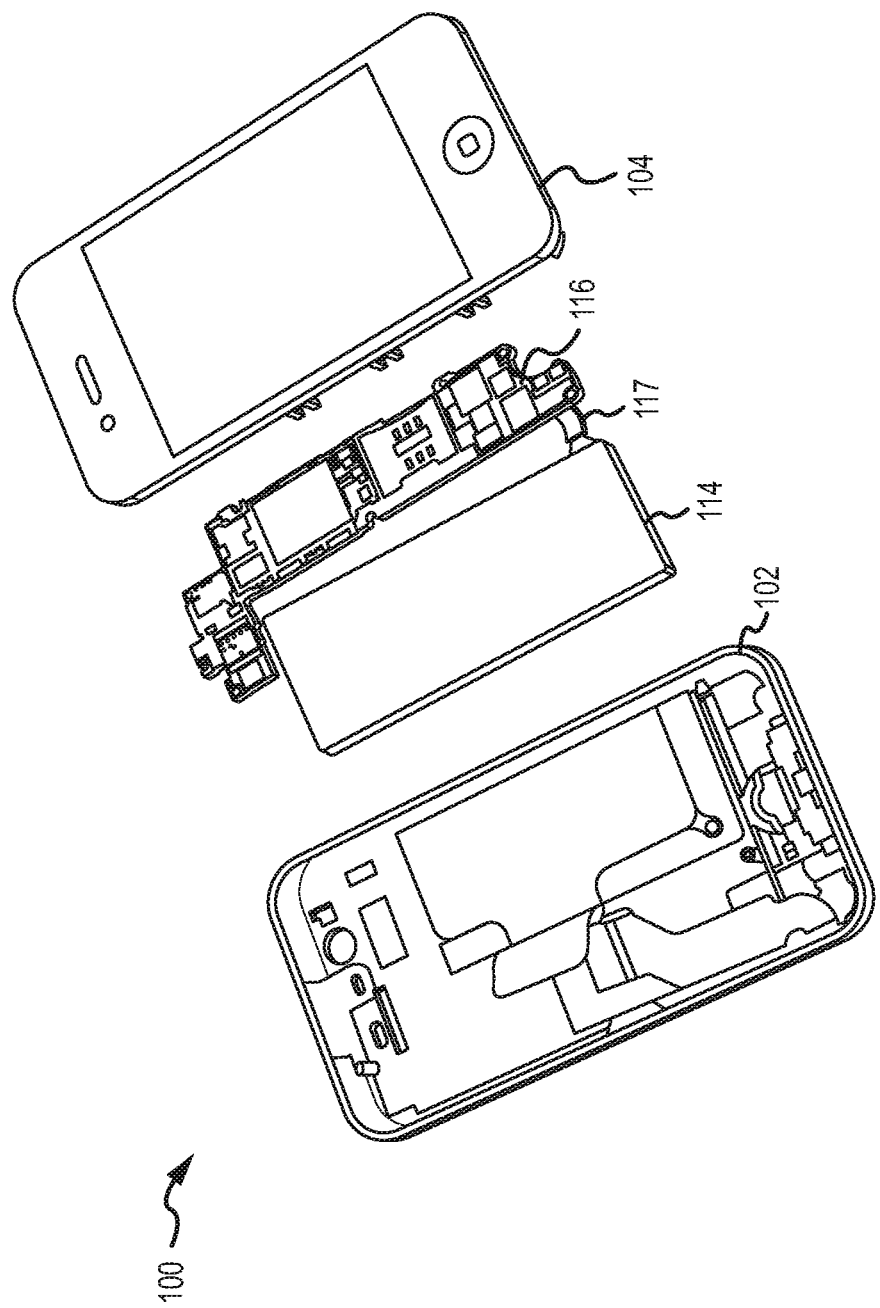
FIG. 1B illustrates the electronic device of FIG. 1A in exploded view in accordance with one embodiment.

Referring now to FIG. 1B, the electronic device 100 embodied in FIG. 1A is illustrated in exploded view. It should be appreciated that the embodiment of the electronic device 100 shown in FIG. 1B is merely illustrative, and that for the sake of discussion, many components contained within the enclosure 102 are not specifically shown in FIG. 1B. Referring now to FIG. 1B, the enclosure 102 houses a battery 114 coupled to a printed circuit board (PCB) 116 via a connector 117. The battery 114 provides electrical power to circuitry located on the PCB 116. The battery 114 may be a rechargeable or replaceable battery, and in any event, such battery-powered implementations may be highly portable, allowing a user to carry the electronic device 100 while traveling, working, exercising, and so forth.

The battery 114 may take many physical forms depending upon the embodiment actually implemented. For example, in the embodiments of the electronic device 100 where the enclosure 102 is curved or shaped, then the battery 114 also may be curved or shaped to match. As mentioned above, conventional batteries for portable electronic devices lack the ability to be bent or curved because this may damage the battery. FIGS. 2A-6B illustrate various possible embodiments where the battery 114 is configured to be flexibly disposed according to the various possible embodiments of the enclosure 102.

Figure 2A:
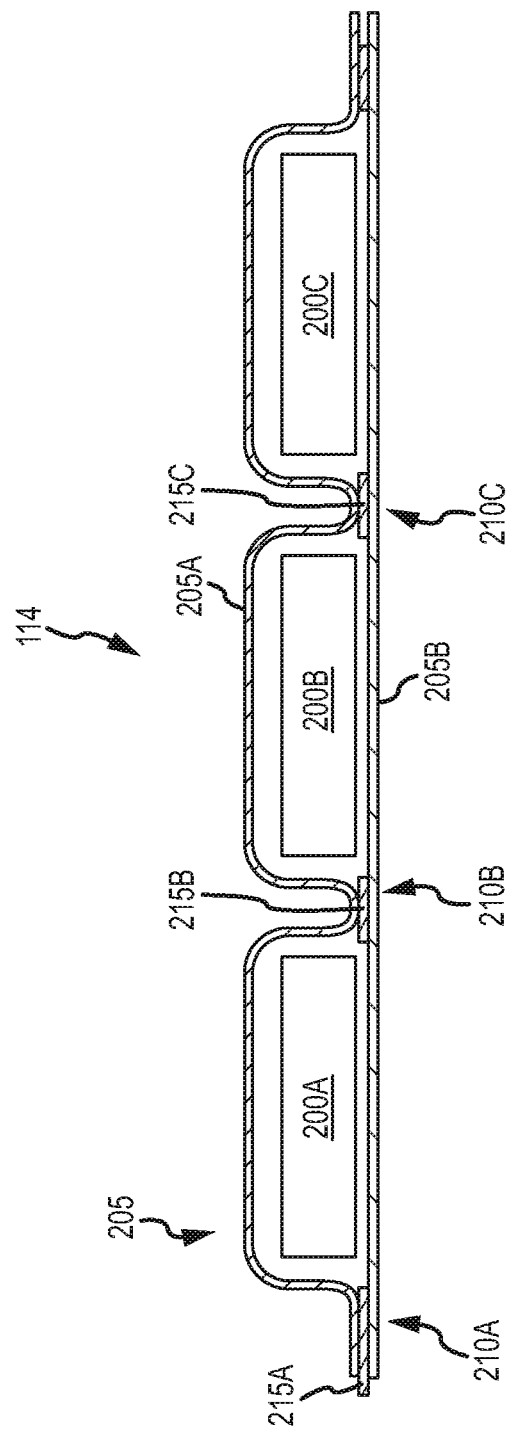
FIG. 2A illustrates a cross section view of the battery shown in FIG. 1B in accordance with one embodiment.

Referring now to FIG. 2A, a cross section of the battery 114 is shown according to one embodiment. As shown, the battery 114 includes a plurality of galvanic or photovoltaic cells 200A-200C. Cells 200A-200C are devices that are capable of converting a form of energy, such as chemical or radiant energy, into electricity. In some embodiments, cells 200A-200C are lithium-ion batteries, such as lithium polymer battery cells. In other embodiments, such as where cells 200A-200C are photovoltaic cells, they may be manufactured using a variety of materials including monocrystalline silicon, polycrystalline silicon, amorphous silicon, cadmium telluride, and/or copper indium selenide to name but a few implementations.

In some embodiments, the type, size, and shape of the individual unit cells 200A-200C may be unique to accommodate a flexible form factor of the electronic device 100. For example, the cell 200A may be a chemical based cell while cell 200B may be a photovoltaic cell where each have different sizes and shapes. In other embodiments, the cells 200A-200C may be substantially the same size and shape, for example, to promote equal current charging and discharging. In still other embodiments, individual cells within the array may be customized such that they have unique electrical properties with respect to each other. For example, in some embodiments, cell 200A may be selected to have a longer life than cells 200B and 200C while cell 200B may be selected to have better discharge characteristics than cells 200A and 200C.

As shown in FIG. 2A, the cells 200A-200C may be enclosed in a flexible enclosure or housing 205. The housing 205 may prevent contaminates, such as dirt and/or water, from coming into contact with the cells 200A-200C. The housing 205 also may act as a heat sink for the cells 200A-200C and dissipate heat generated by the charging and discharging of the cells 200A-200C. In some embodiments, the housing 205 may be formed around the cells 200A-200C using a lamination process where the housing 205 includes multiple layers of material including a top layer 205A and a bottom layer 205B as shown. For example, in some embodiments, each of the top and bottom layers 205A and 205B may be formed using successive layers of plastic and metal, such as a base layer of aluminum with polymer coatings. Other embodiments, where increased fatigue characteristics are desired, may utilize a base layer of steel with polymer coatings. In still other embodiments, the housing 205 may be manufactured using woven materials such as Kevlar® type synthetic fiber available from E. I. du Pont de Nemours and Company.

The top layer 205A may be attached to the bottom layer 205B at a plurality of seal points 210A-210C. The seal points 210A-210C may be used as hinge points for battery 114 allowing battery 114 to be flexibly disposed in electronic devices having a variety of form factors. In some embodiments, these seal points 210A-210C may be formed by gluing the top layer 205A to the bottom layer 205B with adhesives 215A-215C. Depending upon the embodiment ultimately implemented, the materials used as adhesives 215A-215C may be a variety of materials. For example, in some embodiments, the adhesives 215A-215C may be a thermo plastic adhesive. Also, depending upon the embodiment ultimately implemented, each of the adhesives 215A-215C may be formed using different materials or different processes. For example, the adhesive 215A may be formed using a different process that results in adhesive 215A being wider than adhesives 215B and 215C because seal point 210A is more exposed to the atmosphere as compared to seal points 210B and 210C.

Referring still to FIG. 2A, because seal points 210B and 210C exist between cells 200A-200C, fewer overall seal points are needed as compared to conventional approaches where each cell is individually packaged. As a result, battery 114 may be manufactured in less time than conventional batteries. Additionally, a failure of the housing 205 in one location does not ruin the entire battery 114 as it would in conventional batteries where the cell is a single piece. For example, if the adhesive 215A fails or the housing surrounding the cell 200A is breached, then only cell 200A may be impacted, leaving cells 200B and 200C to operate normally. Further, pressure may accumulate as each cell 200A-200C is charged for the first couple of times, and therefore, in some embodiments, the seal points 210A-210C may be formed after the cells 200A-200C have experienced one or more charging cycles.

Figure 2B:
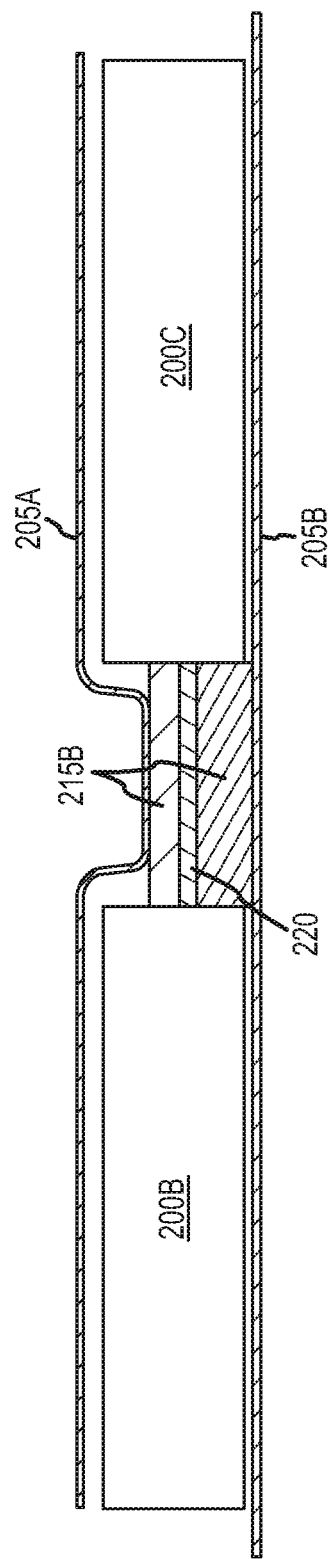
FIG. 2B illustrates certain cells from FIG. 1B in accordance with one embodiment.
Figure 6A:
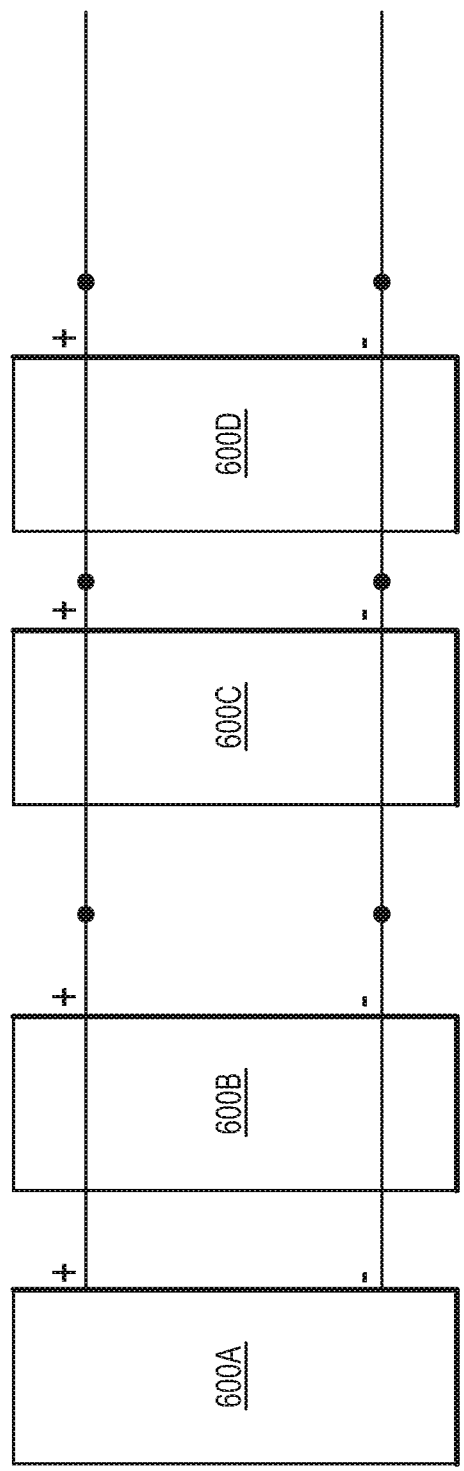
FIGS. 6A and 6B illustrate electrical configurations for the cells shown in FIGS. 2A-5 in accordance with one embodiment.
Figure 6B:
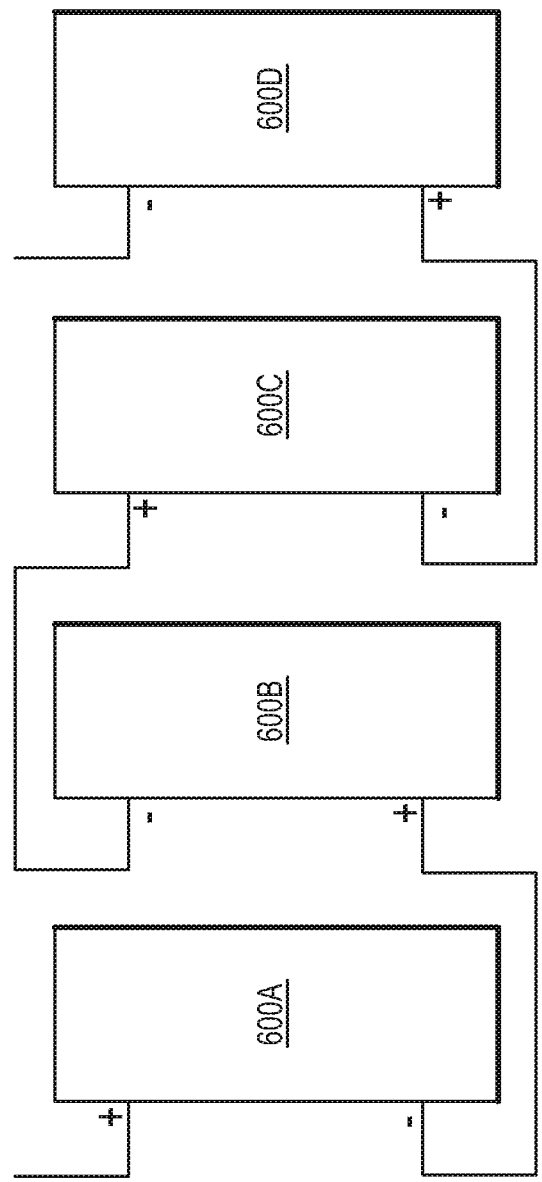

Referring now to FIG. 2B, cells 200B and 200C are shown in greater detail. As shown, the cells 200B and 200C may electrically couple to each other via an interconnection 220. Although not specifically shown in FIG. 2A, similar interconnections may exist between each cell within the array of cells 200A-200C. FIGS. 6A and 6B will illustrate potential wiring configurations in greater detail. Referring still to FIG. 2B, the adhesive 215B may be positioned above and below the interconnection 220. In some embodiments, the adhesive 215B may be laid down in several steps. For example, first a top adhesive layer may be laid down on the bottom lamination layer 205B, then the cells 200B and 200C may be laid down on the bottom lamination layer 205B, then a bottom adhesive layer may be laid down on top of the interconnection 220, and finally the top lamination layer 205A may be placed over the cells 200B and 200C.

Figure 3A:
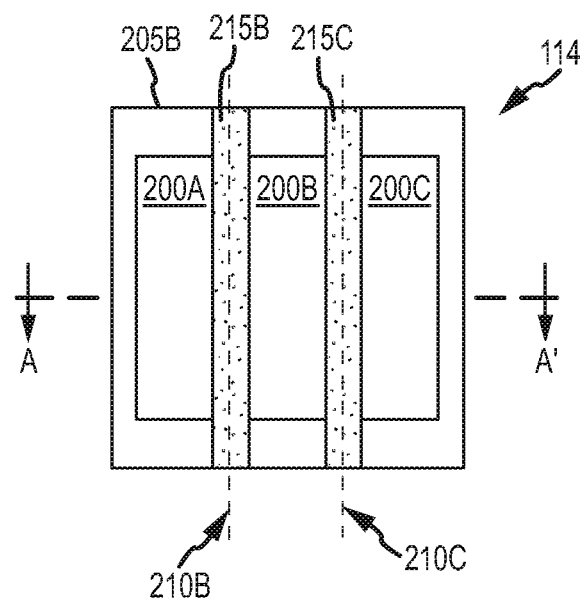
FIG. 3A illustrates a top down view of a battery in accordance with one embodiment.

FIG. 3A illustrates a top down view of the battery 114 with the top layer 205A removed. Referring to the embodiment shown in FIG. 3A, the seal points 210B and 210C may extend along a single axis, such as along the longitudinal axis shown. In the embodiments where the seal points 210B and 210C extend along a single axis, the battery 114 may fold along this single axis. The precise orientation may vary between embodiments depending upon the dimensions of the cells 200A-200C being sealed. For example, if the cells 200A-200C were oriented laterally, then the seal points 210B and 210C may be laterally oriented. In some embodiments, the cells 200A-200C may be oriented angularly so that the seal points 210B and 210C are not parallel to each other.

Figure 3B:
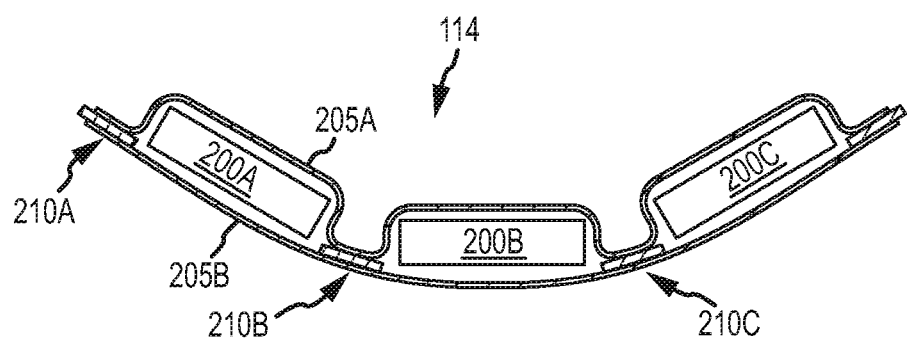
FIGS. 3B and 3C illustrate cross section views of the battery shown in FIG. 3A in accordance with one embodiment.
Figure 3C:
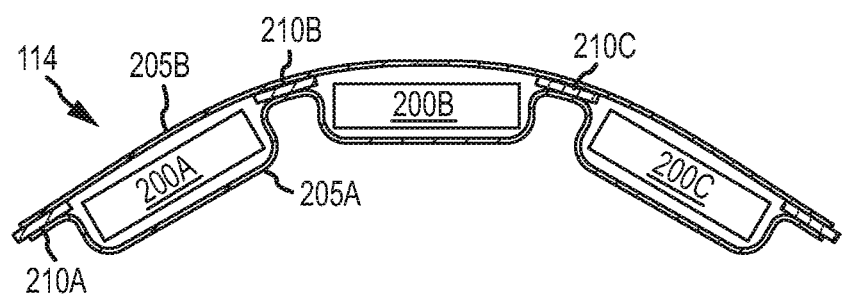

FIGS. 3B and 3C illustrate a cross section of the battery 114 shown in FIG. 2A (including the top layer 205A) taken along line A-A' as the battery 114 is folded in up and down configurations respectively. Referring to FIGS. 3B and 3C, the battery 114 may be folded into generally curved orientations to accommodate the various form factors of electronic devices. The precise degree of curvature may vary depending upon the embodiment ultimately implemented, and in some embodiments, the curve may be asymmetric. For example, in some embodiments, the width of the cells 200A-200C may be non-uniform and/or the width of the seal points 210B and 210C may be non-uniform to allow asymmetric curvature as the battery 114 is folded.

Figure 3D:
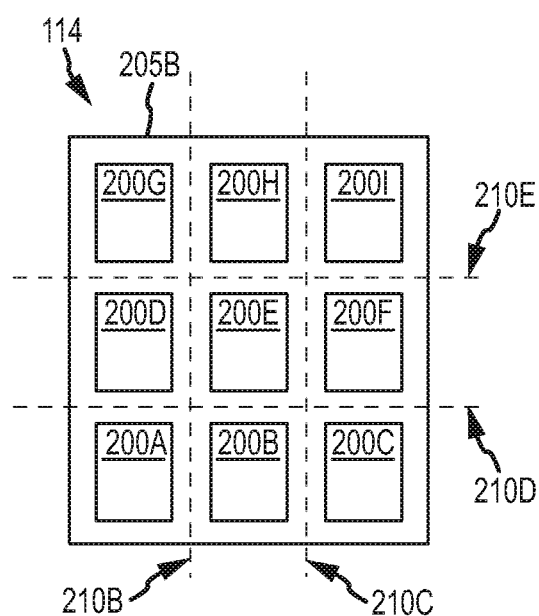
FIG. 3D illustrates a top down view of a battery in accordance with one embodiment.

FIG. 3D illustrates a top down view of the battery 114 with the top layer 205A and seals 210A-210C removed where two dimensional folding is possible. Referring to the embodiment shown in FIG. 3D, additional seal points 210D and 210E may be oriented in a direction that is substantially perpendicular to the seal points 210B and 210C. In this embodiment, additional cells 200D-200I are secured within a grid or array created by the seal points 210B-210E. In the embodiments where the seal points 210B-210E create a grid or array, the battery 114 may be capable of folding in two dimensions. Although FIG. 3D illustrates the cells 200A-200I in the form of a grid, any geometric pattern or shape is possible. For example, the cells 200A-200I may be oriented in a circular pattern in some embodiments.

The embodiments shown in FIGS. 3A-3D may be customized by cutting along the seal points 210B-210E to incrementally achieve certain desired electrical specifications. For example, instead of manufacturing different batteries for different sized electronic devices, a common sized battery, such as the battery 114 show in FIG. 3D with nine cells 200A-200I, may be manufactured and then cut along one or more of the seal points 210B through 210E to accommodate different electronic devices with different electrical requirements. Furthermore, in cases where the housing 205 or seals 210B-210E fail, the failed cell may be severed from the battery 114 to prevent electrical failure.

Figure 4A:
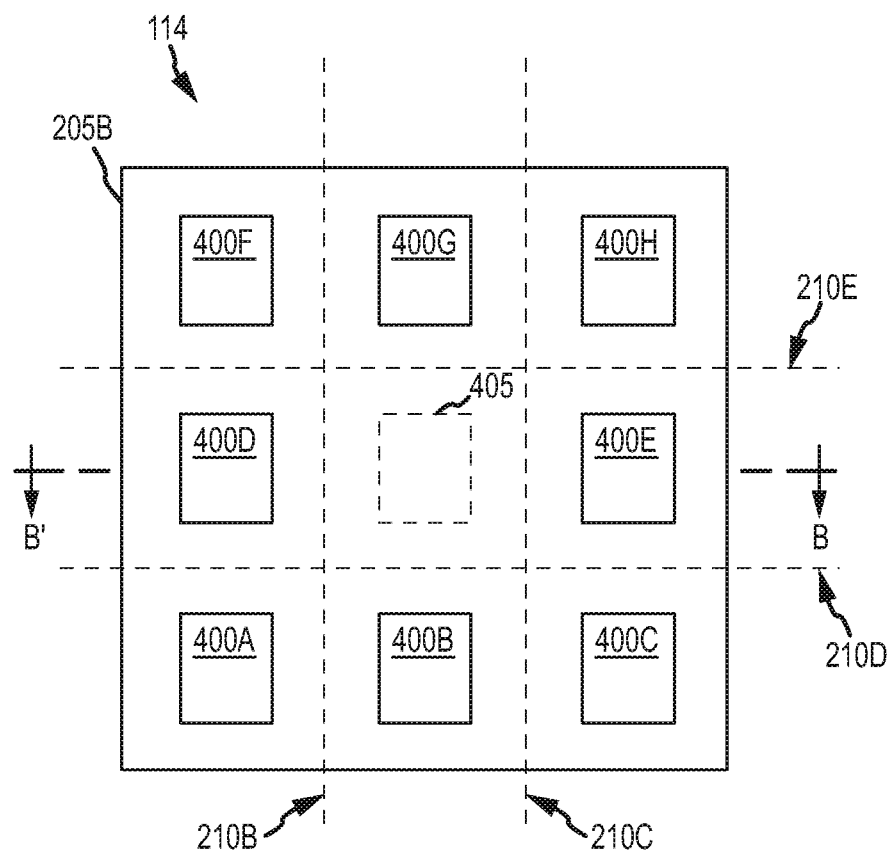
FIG. 4A illustrates a top down view of a layer of a battery in accordance with one embodiment.

FIG. 4A illustrates a top down view of an alternate embodiment of the battery 114 with the top layer 205A and seals 210A-210C removed. Referring to FIG. 4A, the battery 114 includes a plurality of cells 400A-400H arranged in a grid or array. In this embodiment, one or more of the cells in the array may be eliminated creating a void as shown by the dashed box 405. In some embodiments, the void 405 is formed by not placing a cell in between seal points 210B and 210C and seal points 210D and 210E. In these embodiments, there is no cell present when the top layer 205A is applied to the battery 114. Other embodiments may form the void 405 by forming an opening in the top and bottom layers 205A and 205B. For example, the void 405 may be formed by cutting an opening in the bottom layer 205B prior to placing the cells 400A-400H, and then cutting another opening in the top layer 205A prior to applying the top layer 205A to the bottom layer 205B.

Figure 4B:
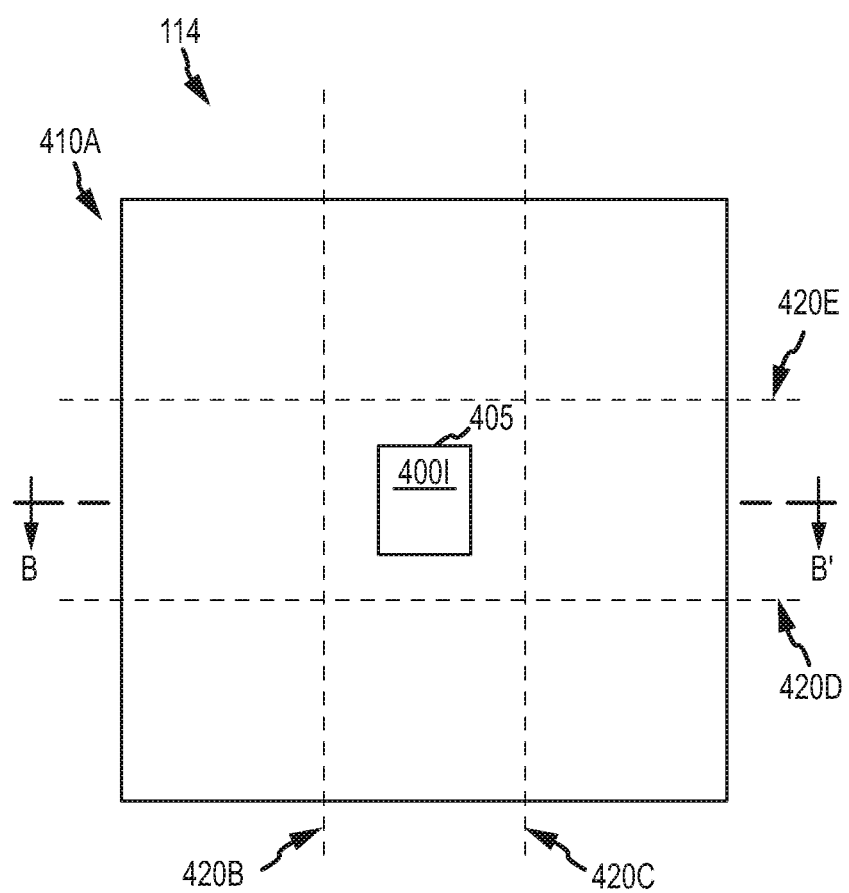
FIG. 4B illustrates a top down view of another layer of a battery in accordance with one embodiment.

One or more electronic components may be located within the void 405. For example, FIG. 4B illustrates the top layer 205A with a cell 400I co-located such that combining the top layer 205A with the bottom layer 205B shown in FIG. 4A results in an interdigitated structure. Referring to FIGS. 4A and 4B, a cross section taken along the line BB' results in the cross section shown in FIG. 4C.

Figure 4C:
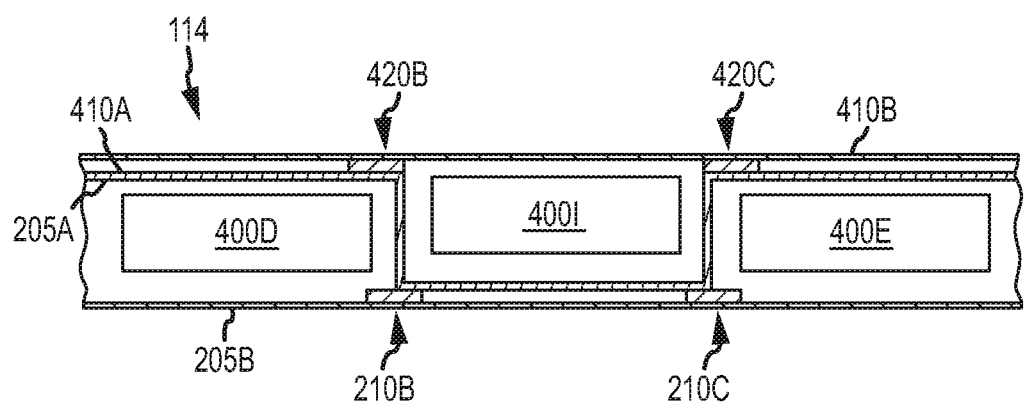
FIG. 4C illustrates a cross section of combining the layers of FIGS. 4A and 4B in accordance with one embodiment.

Referring now to FIG. 4C in conjunction with FIGS. 4A and 4B, the cell 400I may be mounted to the bottom layer 410B in between seal points 420B and 420C. The seal points 420B and 420C may couple the bottom layer 410B to the top layer 410A. The seal points 420B and 420C may be positioned on the top layer 410A such that they are substantially the same distance apart as the seal points 210B and 210C. As shown, when the seal points 420B and 420C are aligned with the seal points 210B and 210C, the cell 400I may be interdigitated within the cells 400D and 400E to form the battery 114. Although not specifically shown in FIG. 4C, the process of stacking may continue such that additional cells may be stacked vertically and electrically connected to the cells 400D, 400E, and 400I.

Figure 5A:
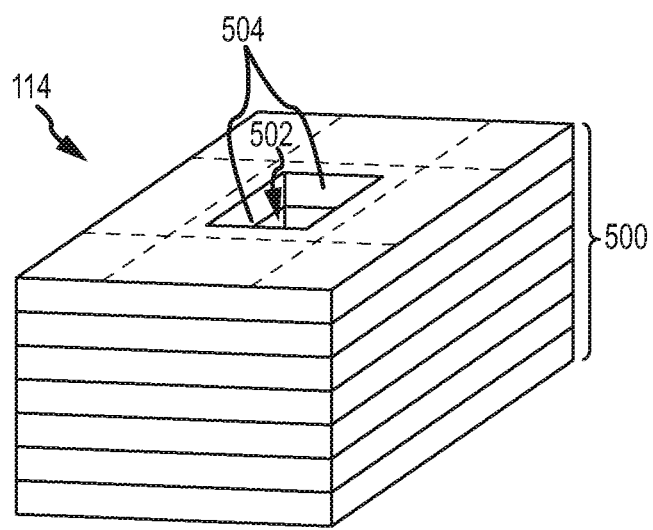
FIG. 5A illustrates an isometric view of a battery in accordance with one embodiment.

FIG. 5A illustrates an isometric view of an embodiment where the battery 114 includes multiple layers of cells 500. Referring to FIG. 5, the individual cells in each layer may be arranged in a planar fashion. For example in some embodiments, the cells in each layer may be arranged according to the orientation shown in FIG. 3D with cells located in each portion of the grid or array. In other embodiments, however, the cells in each layer may be arranged according to the orientation shown in FIG. 4A where one or more of the cells may be missing from the grid or array. Of course, the layers 500 shown in FIG. 5A may include various combinations where some layers have cells in each portion of the grid or array while other layers have one or more cells missing from one or more locations of the grid or array.

As shown in FIG. 5A, the stacking of layers with openings in various spaces in the grid or array may create openings in the battery 114 such as the opening 502. The opening 502 may be used to house items that may benefit from being located next to the battery 114. For example, in some embodiments, the opening 502 may be used to house thermoelectric cooler (TEC) so that the battery 114 or other electronic components in the vicinity of the battery 114 may be cooled. The TEC may draw power from the battery 114 as it operates in cooling mode, or alternatively, the TEC may be used to charge the battery 114 as it draws heat from the surrounding electronic components. In some embodiments, the TEC may be formed along the walls 504 of the opening 502 and cells in the stack that have higher cooling needs may be placed close to the TEC. Further, by placing the TEC along the walls 504 other electrical components that may benefit from cooling or heating may be placed in the opening 502 alongside the TEC.

Referring still to FIG. 5A, other electrical devices that may benefit from being located next to the battery 114 may be placed in the opening 502. For example, if the electronic device 100 includes a camera and a flash, then the opening 502 may house a capacitor used by the flash. In these embodiments, one of the layers 500 may include an array of cells that have greater burst current capabilities than cells in other layers 500 and this layer may be coupled to a flash located in the opening 502.

Figure 5B:
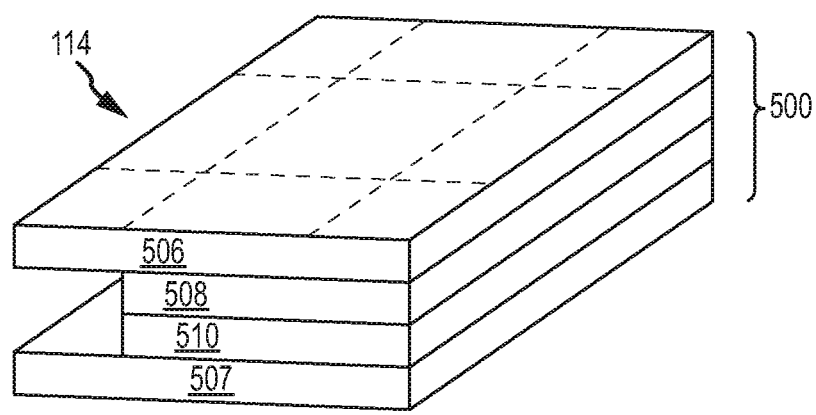
FIG. 5B illustrates an isometric view of a battery in accordance with another embodiment.

While the embodiment shown in FIG. 5A includes multiple uniformly sized layers, other embodiments are possible where the layers 500 are non-uniform and/or stacked in a non-uniform manner. For example, FIG. 5B illustrates an isometric view of an alternate embodiment of the battery 114 where the multiple layers of cells 500 are not uniformly sized. Referring briefly to the embodiment shown in FIG. 5B, the multiple layers of cells 500 may include layers 506 and 507 that have a larger area than layers 508 and 510. Also, in some embodiments, layers 506 and 507 may be thicker than layers 508 and 510, for example, because the cells in layers 506 and 507 are made from different materials than layers 508 and 510. The non-uniformity of layers 506-510 may be desirable, for instance, when the battery 114 is being conformed to the shape of an enclosure for an electronic device.

Various electrical configurations are available for the cells in the arrays or grids described above with respect to FIGS. 2A-5B. FIGS. 6A and 6B illustrate just two of these electrical configurations, however, many other configurations are within the scope of this disclosure. Referring first to FIG. 6A, cells 600A-600D are shown connected electrically in parallel. Thus each of the cells 600A-600D shown in FIG. 6A may include a positive terminal and a negative terminal, where the positive terminals are respectively connected to each other and the negative terminals are respectively connected to each other. Referring now to FIG. 6B, cells 600A-600D are shown connected electrically in serial. Thus each of the cells 600A-600D shown in FIG. 6B may include a positive terminal and a negative terminal, where the positive terminals are respectively connected to a negative terminal of a prior cell and the negative terminals are respectively connected to a positive terminal of a prior cell.

Referring briefly to FIG. 2A in conjunction with FIGS. 6A and 6B, any one of the cells 600A-600D may correspond to any one of the cells 200A-200C and either or both of the positive and negative lines shown in FIGS. 6A and 6B may correspond to the interconnection 220. In these embodiments, any one of the cells may be severed from the battery 114 after the battery 114 has been manufactured, thereby allowing the battery 114 to be customized to a desired electrical characteristic or desired physical characteristic after manufacture. This may be desirable from a manufacturing perspective, where each of the batteries may be manufactured in the same manner and then later customized based upon the particular electronic device in which they are implemented. This may be particularly helpful to a manufacturer of several consumer electronic devices. For example, the same battery may be manufactured for a tablet computer as a mobile phone, where the electrical requirements of the tablet are twice as much as the mobile phone and the physical space requirements of the tablet are greater than the mobile phone. In these embodiments, a single battery may be manufactured, however, half of the battery may be severed to meet the electrical requirements and space constraints of the mobile phone whereas the entire battery may be used in the tablet computer.

The severability of the cells within the battery also may be helpful from a failure perspective. For example, referring to FIG. 2A, in cases where the housing 205 or seals 210A-210C fail, the failed cell may be severed from the battery 114 to prevent electrical failure.

What is claimed is:

1. A flexible battery pack comprising:
   a plurality of cells;
   a conductive layer electrically connecting two adjacent cells;
   a plurality of laminate layers enclosing the cells, the laminate layers comprising a top laminate layer and a bottom laminate layer;
   a to adhesive layer adjacent to the to laminate layer; and
   a bottom adhesive layer adjacent to the bottom laminate layer;
   wherein the to adhesive layer and the bottom adhesive layer couple the top and bottom laminate layers such that each of the plurality of cells is isolated from each other; and
   the conductive layer is positioned between the top adhesive layer and the bottom adhesive layer.

2. The flexible battery pack of claim 1, wherein the plurality of cells comprise first and second cells, and wherein the top and bottom laminate layers form first and second enclosures about the first and second cells, and wherein the first and second enclosures are not of the same size.

3. The flexible battery pack of claim 1, wherein the plurality of cells are arranged in an array and at least one cell within the array is missing.

4. The flexible battery pack of claim 3, wherein a thermoelectric cooler replaces the at least one cell within the array that is missing.

5. The flexible battery pack of claim 3, wherein a flash replaces the at least one cell within the array that is missing.

6. The flexible battery pack of claim 3, wherein a camera replaces the at least one cell within the array that is missing.

7. The flexible battery pack of claim 1, wherein at least one of the cells in the plurality has been severed from the plurality of cells.

8. The flexible battery pack of claim 3, wherein the array include cells in the horizontal and vertical directions.

9. The flexible battery pack of claim 8, wherein the cells are electrically connected in parallel.

10. A flexible battery pack comprising:
    a group of cells;
    a top and a bottom laminate layer enclosing the group of cells;
    a first adhesive layer adjacent the top laminate layer;
    a second adhesive layer adjacent the bottom laminate layer, the first and second adhesive layers surrounding each of the plurality of cells to define a group of enclosures;
    a conductive layer electrically connected to an adjacent pairs of cells of the group of cells, the conductive layer positioned between the first adhesive layer and the second adhesive layer; and
    an electronic component; wherein
    each of the group of cells is positioned in a separate enclosure of the group of enclosures; and
    the electronic component is positioned in one of the group of enclosures.

11. The flexible battery pack of claim 10 wherein:
    the plurality of cells are arranged in an array; and
    at least one of the cells in the plurality has better electrical discharge characteristics than the rest of the cells in the plurality.

12. The flexible battery pack of claim 10 wherein the first and second adhesive layers define a hinge point between two adjacent enclosures, thereby allowing the battery pack to be folded at the hinge point.

13. The flexible battery pack of claim 10 wherein a least one of the laminate layers is a heat sink.

14. The flexible battery pack of claim 10 wherein the battery pack is flexible in at least two dimensions.

15. The flexible battery pack of claim 10 wherein the battery pack comprises a geometric pattern.

16. The flexible battery pack of claim 10, wherein said electronic component is a camera.

17. A flexible battery pack comprising:
    a plurality of battery cells;
    a flexible top laminate layer and a flexible bottom laminate layer surrounding the plurality of cells;
    an adhesive layer disposed between the top laminate layer and the bottom laminate layer, the adhesive layer surrounding each of the plurality of battery cells; and
    a conductive layer electrically connected to an adjacent pair of cells of the plurality of cells, the conductive layer positioned within the adhesive layer, wherein and
    the top laminate layer and the bottom laminate layer are folded.

18. The flexible battery pack of claim 17 wherein the battery cells comprise galvanic cells or photovoltaic cells.

* * * * *

UNITED STATES PATENT AND TRADEMARK OFFICE
CERTIFICATE OF CORRECTION

PATENT NO. : 9,343,716 B2
APPLICATION NO. : 13/339733
DATED : May 17, 2016
INVENTOR(S) : Fletcher R. Rothkopf et al.

It is certified that error appears in the above-identified patent and that said Letters Patent is hereby corrected as shown below:

In the claims

In column 9, at line 41, delete "to" (first occurrence) and insert --top--.

In column 9, at line 41, delete "to" (second occurrence) and insert --top--.

In column 9, at line 44, delete "to" and insert --top--.

Signed and Sealed this
Twenty-sixth Day of July, 2016

Michelle K. Lee
*Director of the United States Patent and Trademark Office*